US008678271B2

(12) United States Patent
Tameerug

(10) Patent No.: US 8,678,271 B2
(45) Date of Patent: Mar. 25, 2014

(54) METHOD FOR PREVENTING VOID FORMATION IN A SOLDER JOINT

(75) Inventor: Phanit Tameerug, San Jose, CA (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 336 days.

(21) Appl. No.: 11/823,056

(22) Filed: Jun. 26, 2007

(65) Prior Publication Data
US 2009/0001138 A1    Jan. 1, 2009

(51) Int. Cl.
*B23K 1/20* (2006.01)
*B23K 35/02* (2006.01)

(52) U.S. Cl.
USPC ............ 228/174; 228/245; 228/246; 228/249

(58) Field of Classification Search
USPC .................................. 228/246, 174, 245, 249
See application file for complete search history.

(56) References Cited

U.S. PATENT DOCUMENTS 5,354,623 A * 10/1994 Hall .............................. 428/610
5,727,727 A *  3/1998 Ead ............................. 228/123.1
6,504,723 B1     1/2003 Fitzgerald
2007/0152321 A1 *  7/2007 Shi et al. ....................... 257/704
2007/0284737 A1 * 12/2007 Too et al. ...................... 257/737

FOREIGN PATENT DOCUMENTS

DE          2032939          1/1972
JP       03254393 A     * 11/1991
JP        3254393 A        11/1991

* cited by examiner

*Primary Examiner* — Devang R Patel
(74) *Attorney, Agent, or Firm* — Farjami & Farjami LLP

(57) ABSTRACT

In one disclosed embodiment, the present method for preventing void formation in a solder joint formed between two metallic surfaces includes forming at least one slit in a layer of solder to form a slit solder layer, positioning the slit solder layer between the two metallic surfaces, and heating the slit solder layer to form the solder joint, wherein the at least one slit forms an outgas alley to prevent void formation in the solder joint. Where solder joint width is a concern, the present method includes applying external pressure concurrently with heating. The outgas alley is formed to provide a ready avenue of escape for flux gasses produced during formation of the solder joint.

20 Claims, 6 Drawing Sheets

METHOD FOR PREVENTING VOID FORMATION IN A SOLDER JOINT

TECHNICAL FIELD

The present invention is generally in the field of bonding metal surfaces. More particularly, the invention is in the field of solder joint formation for bonding metal surfaces.

BACKGROUND ART

Solder joints are widely used to join two metallic materials, providing a bond having electrical conductivity, low thermal impedance, and mechanical durability. Depending on the particular application in which they are being utilized, solder joints may be relied upon for their ability to accommodate thermal expansion stresses, to form a mechanically sound joint that is stable across a range of temperatures, to resist moisture, and to provide low thermal impedance, for example. In the semiconductor device applications, a solder joint can be used to join an active device, such as a microprocessor semiconductor die, to a heat spreader. Used in this way, low thermal impedance and uniform heat dissipation are keys to satisfactory solder joint performance.

A conventional method for forming a solder joint between metal surfaces typically include depositing flux on the metal surfaces, placing a solder material between the surfaces, and then heating the solder material to form the solder joint. In the conventional method, the flux, which outgases as the solder is heated, can disperse into the solder material and form "voids," which can, for example, reduce the mechanical strength of the solder joint. More problematic for semiconductor device applications is that a void in a solder joint can act as effective local insulator, resulting in sharply increased thermal impedance around the void. The presence of insulating voids in a solder joint used to attach an active semiconductor device to a heat spreader, for example, may result in overheating, damage, and ultimately failure of the device. Thus, voids can undesirably reduce the effectiveness of solder joints.

SUMMARY

A method for preventing void formation in a solder joint, substantially as shown in and/or described in connection with at least one of the figures, as set forth more completely in the claims.

DETAILED DESCRIPTION OF THE INVENTION

The present invention is directed to a method for preventing void formation in a solder joint. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the present invention, which use the principles of the present invention, are not specifically described in the present application and are not specifically illustrated by the present drawings.

Figure 1:
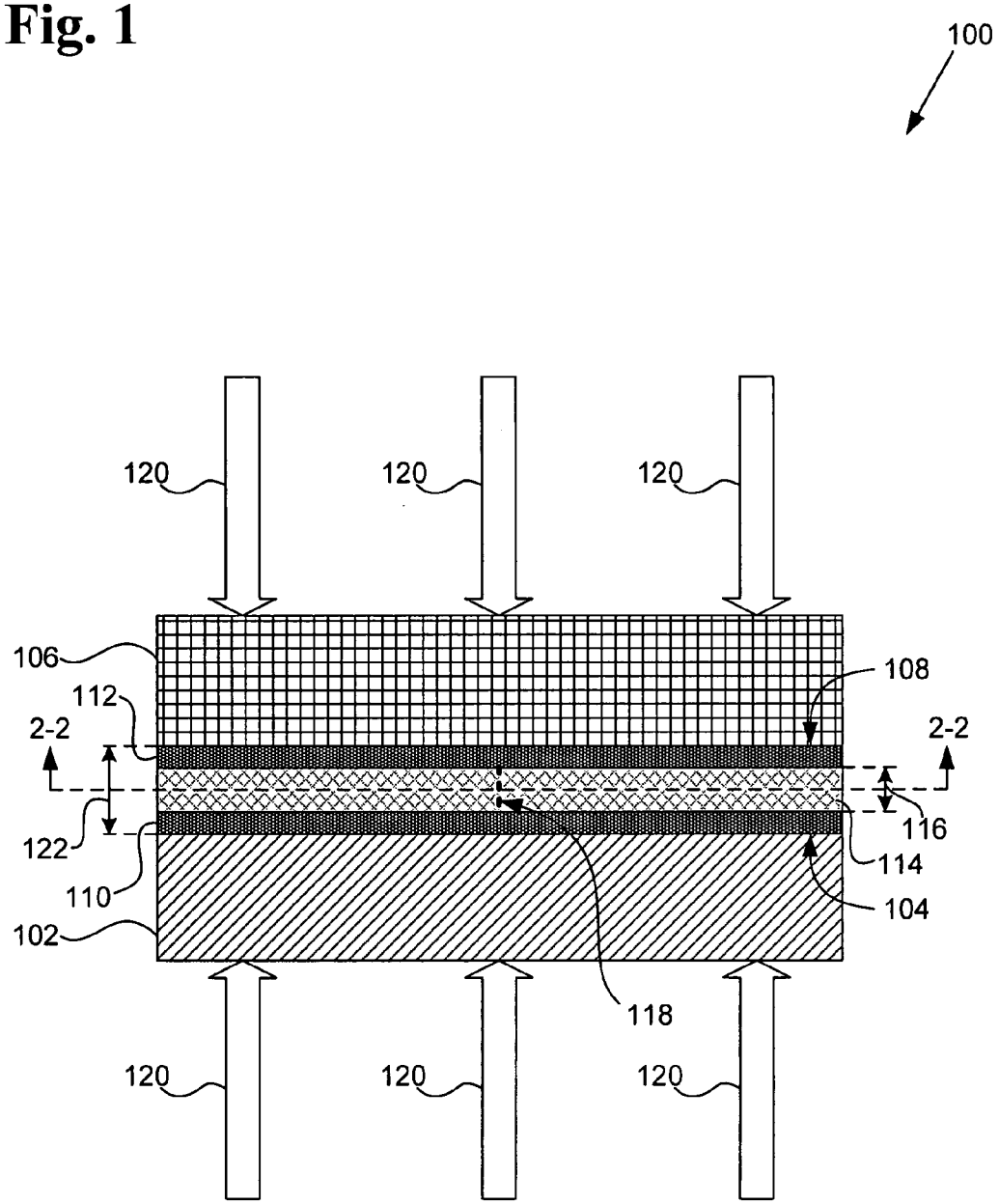
FIG. 1 illustrates a cross-sectional view of an exemplary slit solder layer situated between two exemplary metallic surfaces in accordance with one embodiment of the present invention.

FIG. 1 shows a cross-sectional view of two metallic surfaces prepared for attachment by a solder joint, according to one embodiment of the present invention. Structure 100 in FIG. 1 shows metallic layer 102 having metallic surface 104, and metallic layer 106 having metallic surface 108. The solder joint union depicted in Structure 100 may correspond to, for example, bonding of two sheets of metal or joining a heat spreader to a back metallization layer formed on a semiconductor die. Metallic layer 102 and metallic layer 106 may comprise any solderable metals, including but not limited to copper, aluminum, and gold.

Also present in structure 100 are flux layers 110 and 112. Flux layer 110 can be deposited on metallic layer 102 to remove oxidation from metallic surface 104 prior to formation of a solder joint between metallic surface 104 and metallic surface 108. Flux layer 110 can comprise any suitable flux, as known in the art, and may be selected, for example, from fluxes designated as mild, medium, or active. Similarly, flux layer 112 can comprise any suitable flux, and may be selected so as to optimize removal of an oxidation layer from metallic surface 108.

As further shown in FIG. 1, structure 100 includes a layer of solder in which slit 118 has been formed to form slit solder layer 114. Slit solder layer 114 may comprise any solder appropriate to the materials and environment of the particular solder joint being formed. More specifically, slit solder layer 114 may comprise a low melting point solder such as indium, a medium melting point solder, or a high melting point solder, for example, gold. Slit solder layer 114 may also comprise any solder conventionally used for joining electronic components, such as tin-lead solder. Slit solder layer 114 has thickness 116, which can assume a range of values depending on the requirements of the particular application. As an example, thickness 116 of slit solder layer 114 may be approximately 12 millimeters.

Slit 118 in solder layer 114 in FIG. 1 forms an outgas alley to provide an avenue of escape for outgassing of flux layers 110 and 112 as slit solder layer 114 is heated to form the solder joint. FIG. 1 also includes lines of pressure 120 which represent an external force that may optionally be applied to slit solder layer 114 during heating. By applying external pressure 120 during heating, solder joint width 122, which is the distance between metallic surfaces 104 and 108, can be controlled so that the final solder joint width meets the desired specification of the particular application.

Figure 2:
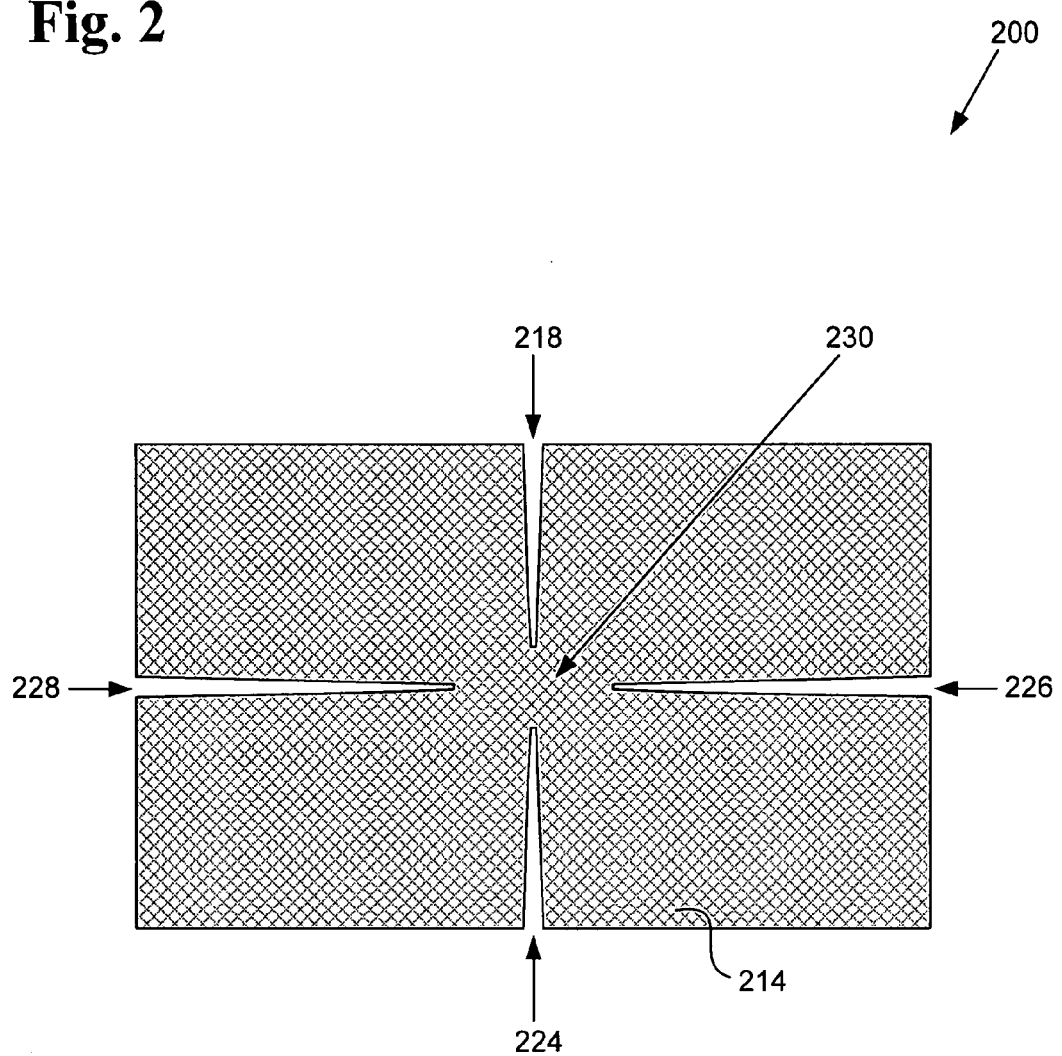
FIG. 2 illustrates a top cut-away view of the slit solder layer in FIG. 1.

Turning to FIG. 2, structure 200 of FIG. 2 shows a top cut-away view of slit solder layer 114 along line 2-2 in FIG. 1. Slit solder layer 214 and slit 218 in FIG. 2 correspond respectively to slit solder layer 114 and slit 118 in FIG. 1. Slit solder layer 214 has center region 230 and slits 218, 224, 226, and 223. As is evident from the placement of line 2-2 in FIG. 1, structure 200 in FIG. 2 depicts a slice of slit solder layer 114 taken at its approximate middle. Also, the cross-sectional view of slit solder layer 114 in FIG. 1 corresponds to a cross-sectional view along slits 226 and 228 of slit solder layer 214 in FIG. 2.

In the embodiment of the present invention in FIG. 2, slits 218, 224, 226, and 228 are formed in slit solder layer 214 to form outgas alleys to provide outlets for flux outgassing. Slits 218, 224, 226, and 228 can be formed by utilizing an etch process or other suitable method to remove appropriate sections of solder material. In slit solder layer 214, center region 230 remains intact, permitting it (i.e. slid solder layer 214) to be handled as a single layer. In other embodiments, the invention's slit solder layer may have fewer or more than four slits, or may be partitioned by one or more slits into two or more discrete pieces. In one embodiment, the slits formed in a slit solder layer may collectively form a starburst shape. Thus, the number and configuration of slits which may be formed in a slit solder layer according to the present invention are numerous and varied.

As shown in FIG. 2, the present invention forms slits 218, 224, 226, and 228 in slid solder layer 214 to provide outgas alleys for gasses formed during the volatile removal of an oxidation layer from a metallic surface. Formation of outgas alleys, such as the outgas alleys formed by slits 218, 224, 226, and 228 in structure 200, prevents solder joint void formation, which is a problem that plagues conventional methods for forming solder joints, particularly solder joints formed between large metallic surfaces.

During formation of a solder joint, solder is heated to form the solder joint. As the solder heats, flux deposited between the solder and a metallic layer to be joined by the solder joint is volatized, thereby forming gasses. By providing avenues of escape for the outgassing flux that direct the gases away from the solder joint, the present method reduces the likelihood that the gasses will penetrate into the solder joint and form voids, which are air pockets in the solder joint that would otherwise be filled by solder material. Voids are typically seen in solder joints produced by conventional methods, which do not include creation of outgas alleys as outlets for flux gasses. A significant advantage of the present invention over conventional approaches to formation of solder joints is prevention of void formation.

The presence of voids in a solder joint is undesirable because it introduces an inhomogeneity in the solder joint which produces local irregularities in its thermal properties. Those properties can include mechanical strength, the ability to expand and contract, electrical conductivity, and thermal impedance, for example. Because the presence or absence of certain properties may constitute the selection criteria for the materials utilized in solder joint formation, alteration of those expected properties may compromise or even entirely undermine the effectiveness of the solder joint. Because a void formed in a solder joint is a poor conductor of electricity and heat, for example, presence of voids in a solder joint may prevent the solder joint from meeting electrical conductivity or heat dissipation specifications established for it. Voids in a solder joint may also reduce its mechanical strength, thereby causing it to fail in conditions it was designed to withstand.

The thermal properties of a solder joint are particularly important when the solder joint functions as a thermal interface material utilized to protect an active semiconductor device from over heating, by providing it with uniform heat dissipation in conjunction with a heat sink or heat spreader, for example. In that context, the presence of voids can substantially raise the thermal impedance of a solder joint, leading to overheating, damage, and failure of the semiconductor device. The present invention prevents the problems introduced by the presence of voids in solder joints by providing a method for producing substantially void-free solder joints.

Figure 3:
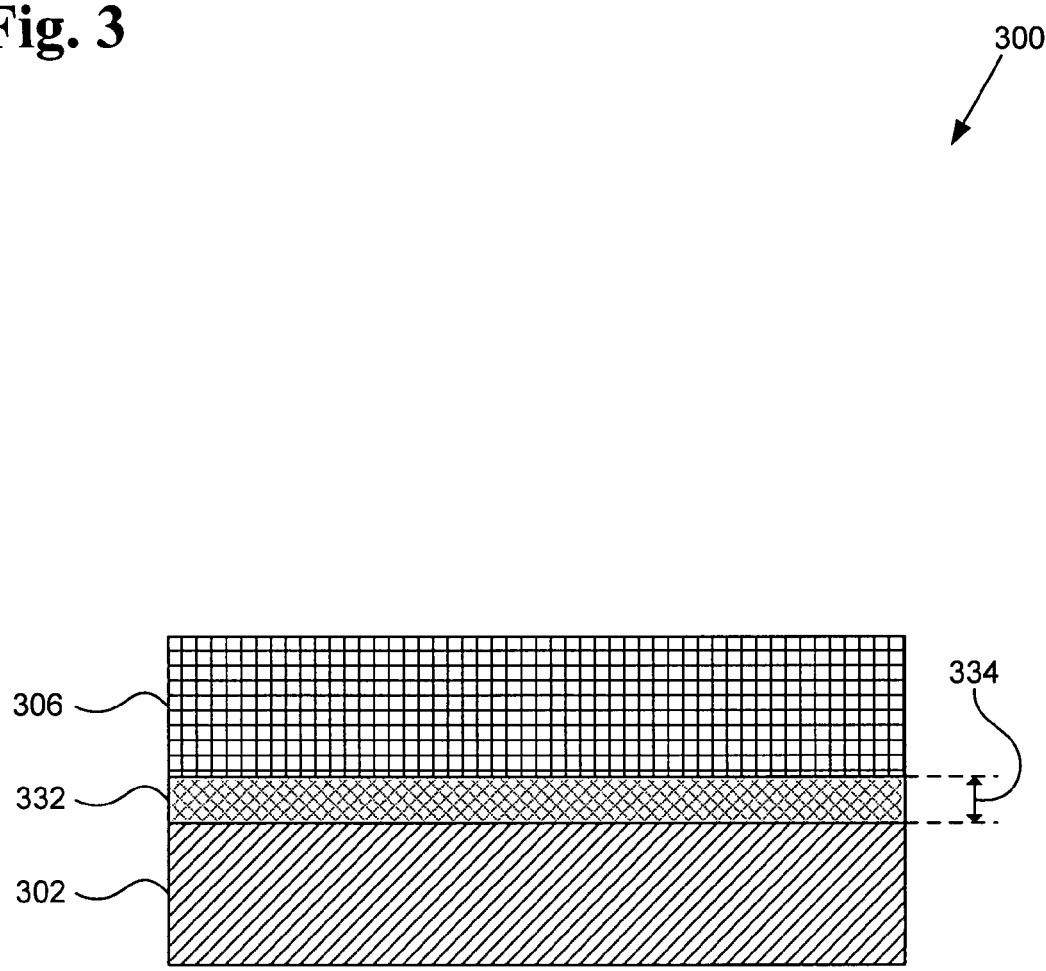
FIG. 3 illustrates a cross-sectional view of two exemplary metallic surfaces joined by a substantially void-free solder joint in accordance with one embodiment of the present invention.

In FIG. 3, structure 300 shows a cross-sectional view of two exemplary metallic surfaces joined by a substantially void-free solder joint, according to an embodiment of the present invention. Structure 300 includes metallic layers 302 and 306, which correspond, respectively, to metallic layers 102 and 106 in FIG. 1. Also shown in FIG. 3 is solder joint 332 having solder joint width 334. Solder joint 332 may comprise an amalgam of the solder material from which slit solder layer 114 in FIG. 1 is formed, and alloys produced at its interfaces with metallic surface 104 and metallic surface 108 in FIG. 1.

By utilizing an embodiment of the invention's slit solder layer 114 to form solder joint 332, the present invention causes solder joint 332 to be substantially free of undesirable voids. In instances in which it is desirable for solder joint width 334 to meet certain dimensional criteria, external pressure can be applied during solder joint formation as shown in FIG. 1 to control solder joint width 334.

Figure 4:
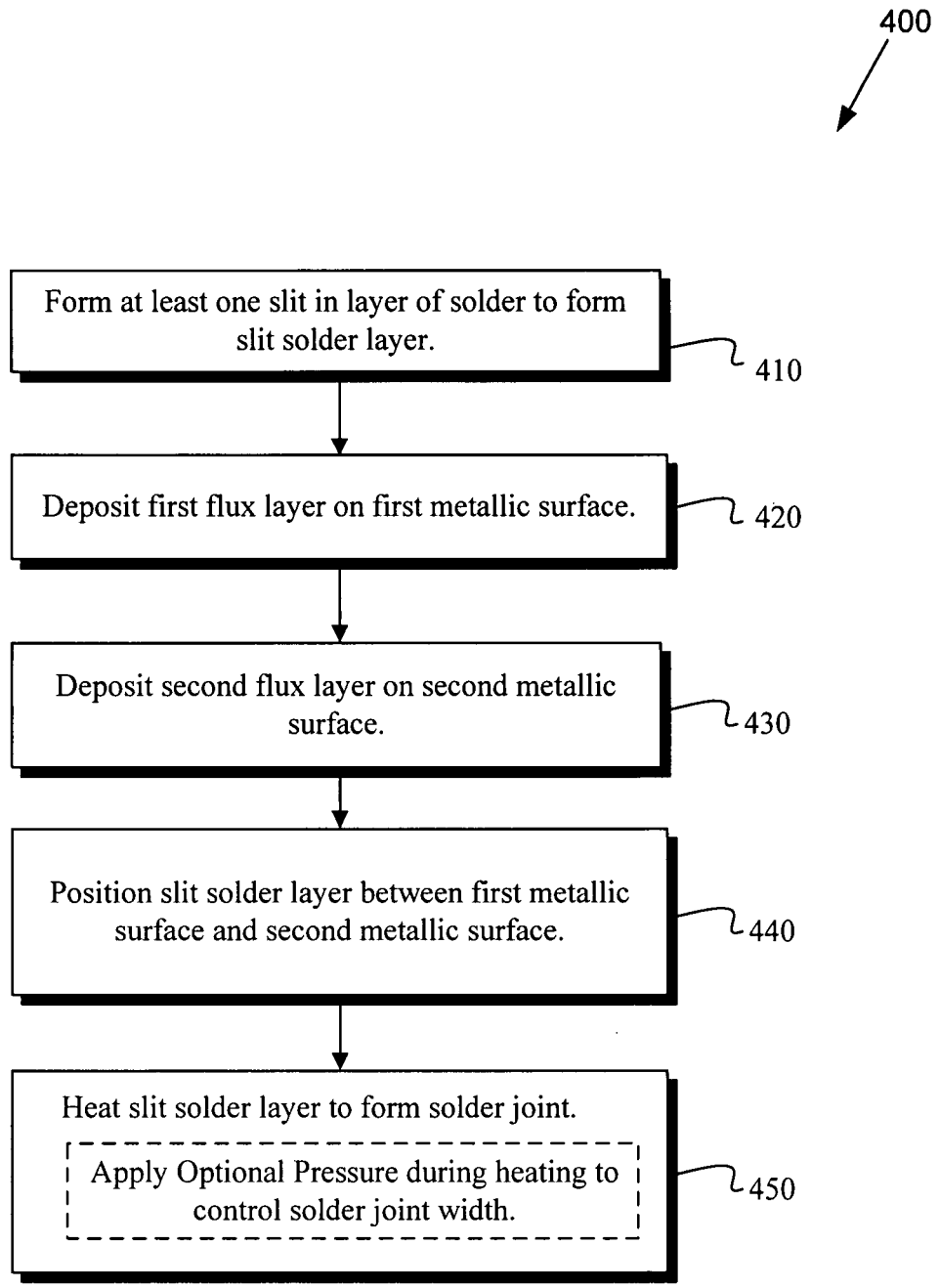
FIG. 4 shows a flowchart illustrating typical steps taken to implement an embodiment of the present invention.

Turning now to FIG. 4, FIG. 4 shows a flowchart illustrating an exemplary method for preventing void formation in a solder joint, according to one embodiment of the present invention. Certain details and features have been left out of flowchart 400 that are apparent to a person of ordinary skill in the art. For example, a step may comprise one or more substeps or may involve specialized equipment or materials, as known in the art. While steps 410 through 450 indicated in flowchart 400 are sufficient to describe one embodiment of the present invention, other embodiments of the invention may utilize steps different from those shown in flowchart 400.

At step 410 in FIG. 4, at least one slit is formed in a layer of solder to form a slit solder layer, e.g., slit solder layer 114 in FIG. 1. As discussed previously, creation of a slit forms an outgas alley permitting escape of volatized flux gasses produced during heating of the slit solder layer. At step 420 in FIG. 4, a first flux layer, e.g., flux layer 110, is deposited on a first metallic surface, e.g., metallic surface 104, in preparation for production of a solder joint. The first flux layer is provided to remove an oxidation layer from the first metallic surface prior to solder joint formation. At step 430, a second flux layer, e.g., flux layer 112, is deposited on a second metallic surface, e.g., metallic surface 108, to prepare the second metallic surface for formation of the solder joint.

At step 440 in FIG. 4, the slit solder layer, e.g., slit solder layer 114, is positioned between the first metallic surface and the second metallic surface. Referring to FIG. 1, it can be seen that step 440 of flowchart 400 corresponds to sandwiching slit solder layer 114 between metallic surfaces 104 and 108, each in contact with respective flux layers 110 and 112 in preparation for being joined.

At step 450 of FIG. 4, the slit solder layer, e.g., slit solder layer 114, is heated to form the solder joint, e.g., solder joint 332. As the solder is heated, the first and second flux layers, deposited respectively on the first and second metallic surfaces at steps 420 and 430 begin to outgas. The outgas alleys formed in the slit solder layer provide a ready avenue for escape of gases formed during formation of the solder joint. As a result, voids are less likely to be formed in the resulting solder joint, and a substantially void-free solder joint is produced. As an optional step, external pressure may be applied to the slit solder layer during heating of the slit solder layer at step 440. Application of external pressure during heating may be used to control solder joint width where such control is desirable.

Figure 5:
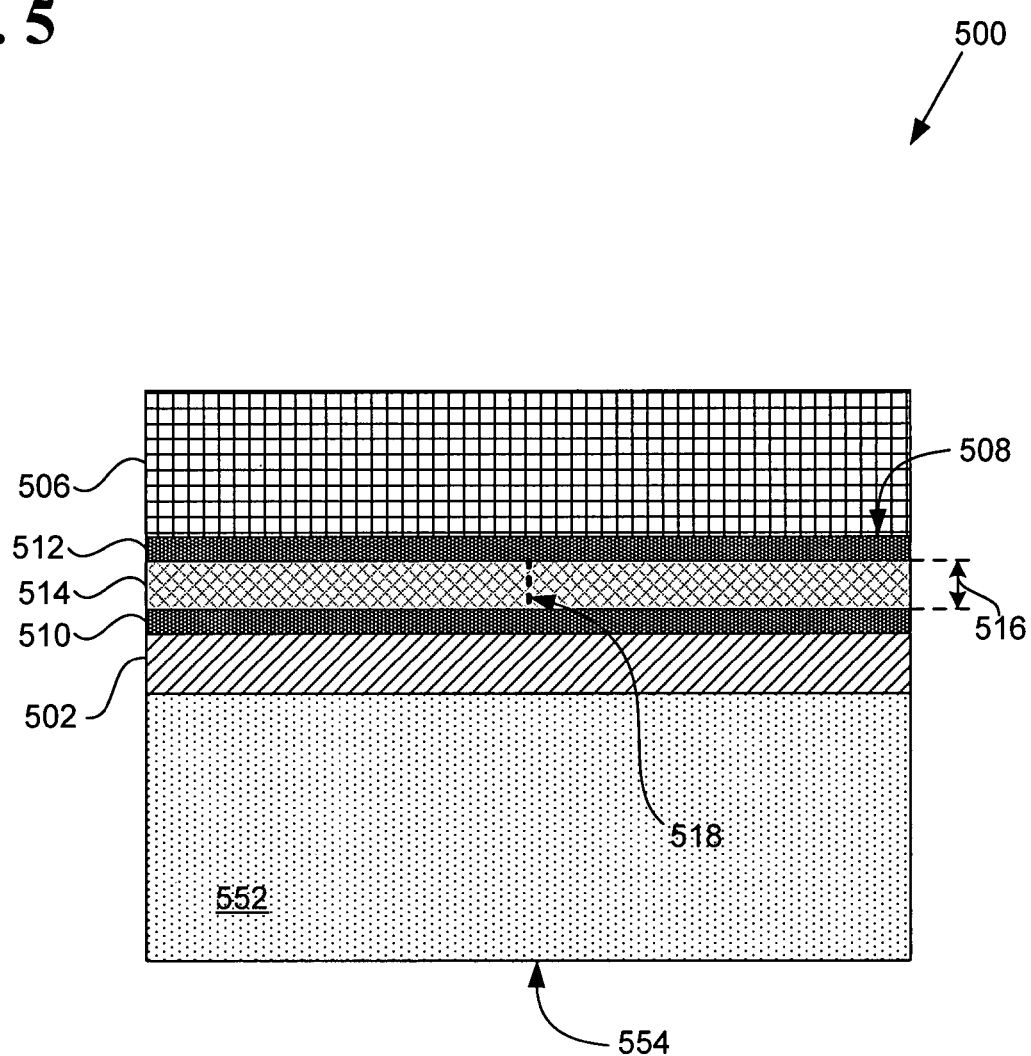
FIG. 5 illustrates a cross-sectional view of an exemplary slit solder layer situated between an exemplary semiconductor die and an exemplary heat spreader in accordance with one embodiment of the present invention.

Referring to FIG. 5, structure 500 in FIG. 5 shows a cross-sectional view of slit solder layer 514 situated between heat spreader 506 and semiconductor die 552 according to one embodiment of the present invention. Structure 500 in FIG. 5 includes back metallization layer 502 having metallic surface 504, flux layer 510, heat spreader 506 having metallic surface 508, and flux layer 512, corresponding, respectively, to metallic layer 102 having metallic surface 104, flux layer 110, metallic layer 106 having metallic surface 108, and flux layer 112 in FIG. 1. Moreover, structure 500 further includes slit solder layer 514 having width 516, in which slit 518 has been created, corresponding, respectively, to slit solder layer 114 having width 116, and slit 118 in FIG. 1. In FIG. 5, metallization layer 502 can be formed on the back surface of semiconductor die 552, which is opposite from active surface 554, in a manner known in the art. Semiconductor die 552 can be, for example, a microprocessor semiconductor die or other type of semiconductor die that requires a heat spreader for dissipating heat.

In the exemplary embodiment shown in FIG. 5, the solder joint to be formed by slit solder layer 514 is utilized to attach heat spreader 506 to metallization layer 502 formed on semiconductor die 552. In that role, the solder joint will be relied upon to provide uniform heat dissipation from semiconductor die 552 to heat spreader 506 to prevent the semiconductor die from overheating. By utilizing slit solder layer 514, an embodiment of the invention can form solder joint between metallization layer 502 on semiconductor die 552 and heat spreader 506 that is substantially free of the voids caused by outgassing of flux layer 510 and/or flux layer 512. Due to the reliable prevention of void formation in a solder joint as a result of utilizing slit solder layer 514, the solder joint formed between semiconductor die 552 and heater spreader 506 can advantageously provide uniform heat dissipation between the die and the heat spreader.

As a result of the present invention's method for preventing void formation in a solder joint, described in the exemplary embodiments set forth in the present application, a semiconductor die is provided with uniform heat dissipation. The fabricated and heat protected semiconductor die, which is provided uniform heat dissipation by using the present invention's method for preventing void formation in a solder joint, can be utilized on a circuit board, for example. The semiconductor die can be packaged, i.e. can be enclosed and/or sealed in suitable semiconductor packages, as known in the art.

Figure 6:
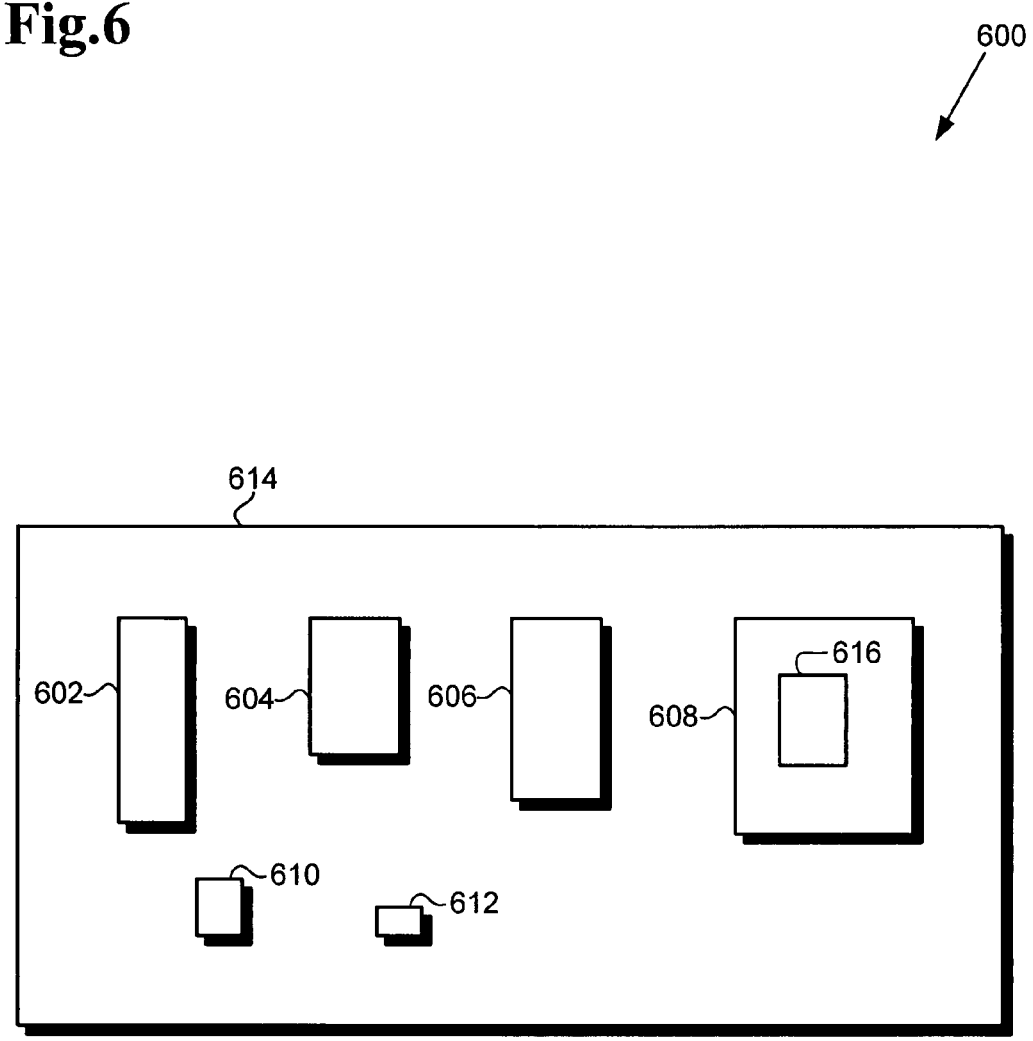
FIG. 6 is a diagram of an exemplary electronic system including an exemplary chip or die attached to a heat spreader by utilizing a slit solder layer in accordance with one embodiment of the present invention.

FIG. 6 is a diagram of an exemplary electronic system including an exemplary chip or die provided uniform heat dissipation as the result of the present invention's method for preventing void formation in a solder joint, in accordance with one or more embodiments of the present invention. Electronic system 600 includes exemplary modules 602, 604, and 606, IC chip 608, discrete components 610 and 612, residing in and interconnected through circuit board 614. In one embodiment, electronic system 600 may include more than one circuit board. IC chip 608 can be a semiconductor die including a heat spreader, which can be attached to a metallization layer on the die by utilizing a substantially void-free solder joint formed according to an embodiment of the present invention. IC chip 608 includes circuit 616, which can be a microprocessor, for example.

As shown in FIG. 6, modules 602, 604, and 606 are mounted on circuit board 614 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 614 can include a number of interconnect traces (not shown in FIG. 6) for interconnecting modules 602, 604, and 606, discrete components 610 and 612, and IC chip 608.

Also shown in FIG. 6, IC chip 608 is mounted on circuit board 614 and can comprise, for example, any semiconductor die that includes a heat spreader that is attached to the die by a substantially void-free solder joint formed by a method of the present invention. In one embodiment, IC chip 608 may not be mounted on circuit board 614, and may be interconnected with other modules on different circuit boards. Further shown in FIG. 6, discrete components 610 and 612 are mounted on circuit board 614 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 600 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

Thus, as discussed above, the present invention utilizes a slid solder layer to provide a ready avenue for escape of flux outgassing during solder joint formation. As a result, the present invention advantageously prevents formation of voids in the solder joint. As a result, solder joints produced according to the present invention are less susceptible to being mechanically or thermally compromised by the presence of such voids. Consequently, solder joints produced according to the present invention are more effective compared to conventional solder joints that include voids.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for preventing void formation in a solder joint has been described.

The invention claimed is:

1. A method for preventing void formation in a solder joint formed between two metallic surfaces, said method comprising:
   forming at least one slit by etching completely through a thickness of a layer of solder to form a slit solder layer, wherein said slit solder layer is partitioned by one or more slits into two or more discrete pieces;
   positioning said slit solder layer between two metallic surfaces;
   heating said slit solder layer to form said solder joint;
   wherein said one or more slits forms an outgas alley that is configured to prevent gases from penetrating into said solder joint to prevent said void formation in said solder joint.

2. The method of claim 1, further comprising depositing a flux layer on each of said two metallic surfaces prior to heating said slit solder layer.

3. The method of claim 2 wherein said flux layer comprises an active flux.

4. The method of claim 1 wherein said slit solder layer comprises a solder selected from the group consisting of a low melting point solder, a medium melting point solder, and a high melting point solder.

5. The method of claim 1 wherein said slit solder layer has a thickness of approximately 12 millimeters.

6. The method of claim 1 wherein a first of said two metallic surfaces comprises a surface of a metallization layer formed on a semiconductor die and a second of said two metallic surfaces comprises a surface on a heat spreader.

7. The method of claim 1 wherein said at least one slit comprises four slits.

8. A method for preventing void formation in a solder joint formed between two metallic surfaces, said method comprising:
   forming at least one slit by etching completely through a thickness of a layer of solder to form a slit solder layer, wherein said slit solder layer is partitioned by one or more slits into two or more discrete pieces;
   positioning said slit solder layer between said two metallic surfaces;
   heating and concurrently applying external pressure to said slit solder layer to form said solder joint;
   wherein said one or more slits forms an outgas alley that is configured to prevent gases from penetrating into said solder joint to prevent said void formation in said solder joint.

9. The method of claim 8, further comprising depositing a flux layer on each of said two metallic surfaces.

10. The method of claim 9 wherein said flux layer comprises an active flux.

11. The method of claim 8 wherein said slit solder layer comprises a solder selected from the group consisting of a low melting point solder, a medium melting point solder, and a high melting point solder.

12. The method of claim 8 wherein said slit solder layer has a thickness of approximately 12 millimeters.

13. The method of claim 8 wherein said external pressure is utilized to control a thickness of said solder joint.

14. The method of claim 8 wherein said two metallic surfaces comprise respective surfaces of a heat spreader and a metallization layer on a semiconductor die.

15. A method for preventing void formation in a solder joint formed between a heat spreader and a semiconductor die, said method comprising:
   forming at least one slit by etching completely through a thickness of a layer of solder to form a slit solder layer, wherein said slit solder layer is partitioned by one or more slits into two or more discrete pieces;
   positioning said slit solder layer between a metal layer formed on said semiconductor die and said heat spreader;
   heating said slit solder layer so as to form said solder joint between said heat spreader and said semiconductor die;
   wherein said one or more slits forms an outgas alley that is configured to prevent gases from penetrating into said solder joint to prevent said void formation in said solder joint.

16. The method of claim 15 further comprising applying external pressure to said semiconductor die and said heat spreader concurrently with said heating so as to control a width of said solder joint.

17. The method of claim 15 wherein said slit solder layer has a thickness of approximately 12 millimeters.

18. The method of claim 15, wherein said semiconductor die is situated on a circuit board.

19. The method of claim 15, wherein said slit solder layer comprises a solder selected from the group consisting of a low melting point solder, a medium melting point solder, and a high melting point solder.

20. The method of claim 15, wherein said semiconductor die is utilized in a circuit board.

* * * * *